(12) United States Patent
Akimoto et al.

(10) Patent No.: US 9,881,984 B2
(45) Date of Patent: *Jan. 30, 2018

(54) ORGANIC ELECTRO-LUMINESCENT DISPLAY DEVICE

(71) Applicant: Japan Display Inc., Tokyo (JP)

(72) Inventors: Hajime Akimoto, Tokyo (JP); Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/334,715

(22) Filed: Oct. 26, 2016

(65) Prior Publication Data

US 2017/0047389 A1    Feb. 16, 2017

Related U.S. Application Data

(63) Continuation of application No. 15/060,181, filed on Mar. 3, 2016, now Pat. No. 9,508,784, which is a
(Continued)

(30) Foreign Application Priority Data

Jul. 11, 2014 (JP) ................................. 2014-143016

(51) Int. Cl.
*H01L 51/52* (2006.01)
*H01L 27/32* (2006.01)
(Continued)

(52) U.S. Cl.
CPC ........ *H01L 27/3262* (2013.01); *H01L 27/323* (2013.01); *H01L 27/3248* (2013.01); *H01L 27/3258* (2013.01); *H01L 27/3276* (2013.01); *H01L 51/003* (2013.01); *H01L 51/5246* (2013.01); *H01L 51/5253* (2013.01); *H01L 51/56* (2013.01); *G09G 3/3225* (2013.01); *H01L 27/1218* (2013.01); *H01L 2227/323* (2013.01); *H01L 2227/326* (2013.01)

(58) Field of Classification Search
CPC ............ H01L 27/3258; H01L 27/3272; H01L 27/42834; H01L 27/3202; H01L 51/5265
See application file for complete search history.

(56) References Cited

U.S. PATENT DOCUMENTS 6,690,032 B1    2/2004    Umetsu
8,809,863 B2    8/2014    Kim et al.
(Continued)

FOREIGN PATENT DOCUMENTS

JP    2010-008677 A    1/2010
JP    2015-125295 A    7/2015
WO    01/08128 A1    2/2001

*Primary Examiner* — Cuong Q Nguyen
(74) *Attorney, Agent, or Firm* — Typha IP LLC

(57) ABSTRACT

An organic EL display device includes an inorganic insulating film including a contact part as an opening where a contact electrode made of a conductive film is exposed, a TFT circuit layer provided on the inorganic insulating film and including a circuit including a thin film transistor, an organic EL element layer provided on the TFT circuit layer and including an organic EL element whose light emission is controlled by the circuit, and a sealing layer covering the organic EL element layer and made of an inorganic insulating material.

5 Claims, 16 Drawing Sheets

Related U.S. Application Data continuation of application No. 14/794,545, filed on Jul. 8, 2015, now Pat. No. 9,312,510.

(51) Int. Cl.
  *H01L 51/00* (2006.01)
  *H01L 51/56* (2006.01)
  *G09G 3/3225* (2016.01)
  *H01L 27/12* (2006.01)

(56) References Cited

U.S. PATENT DOCUMENTS

| | | |
|---|---|---|
| 9,236,423 B2 | 1/2016 | Park et al. |
| 9,305,985 B2 | 4/2016 | Lee |
| 9,508,784 B2 * | 11/2016 | Akimoto ............. H01L 27/3258 |
| 2013/0037807 A1 * | 2/2013 | Fukaya ............... H01L 27/1225 |
| | | 257/57 |
| 2015/0187807 A1 | 7/2015 | Tsuruoka et al. |

* cited by examiner

ORGANIC ELECTRO-LUMINESCENT DISPLAY DEVICE

CROSS-REFERENCE TO RELATED APPLICATIONS

This application is a continuation of U.S. patent application Ser. No. 15/060,181 filed Mar. 3, 2016, which, in turn, is a continuation of U.S. patent application Ser. No. 14/794,545 (now, U.S. Pat. No. 9,312,510) filed on Jul. 8, 2015. Further, this application claims priority from Japanese application JP2014-143016 filed on Jul. 11, 2014, the contents of which are hereby incorporated by reference into this application.

BACKGROUND OF THE INVENTION

1. Field of the Invention

The present invention relates to an organic EL display device and a manufacturing method of the organic EL display device.

2. Description of the Related Art

In recent years, an image display apparatus (hereinafter referred to as "organic EL display device") using a self-luminous body called an organic light emitting diode is put into practical use. Since the self-luminous body is used, as compared with a related art liquid crystal display device, the organic EL display device is superior in visibility and response speed, and further, since an auxiliary illuminating device such as a backlight is not required, further thinning is possible.

International Publication No. WO 01/08128A discloses an electro-optical device in which a conductive member passing through one of two substrates of a liquid crystal panel is used, and the two substrates are electrically connected. JP 2010-008677 A discloses a configuration in which a terminal electrode is formed in an opening formed on a first substrate and overlapping an active driving element formed on the first substrate, and the terminal electrode is electrically connected to a terminal of a wiring board.

SUMMARY OF THE INVENTION

In a thin display device, such as an organic EL display device, reduction in size and weight is required, and the area of the outside of a display area, that is, the area of a so-called frame area is required to be reduced. In the display device as stated above, image display control is performed by a driving integrated circuit element (driver IC (Integrated Circuit)). However, since the driving integrated circuit element is generally mounted on the frame area on the same substrate on which thin film transistors are formed, it is difficult to reduce the area of the frame area of a portion where the driving integrated circuit element is mounted. Besides, there is also a case where the area of the frame area can not be reduced because of mounting of an FPC (Flexible Printed Circuits) or other electronic components in addition to the driving integrated circuit element. On the other hand, International Publication No. WO 01/08128A and JP 2010-8677 A disclose to provide the through hole in the substrate as a base member. However, since a special high-cost process is required, the application to a manufacturing process of a display device to be mass-produced is difficult.

The invention is made in view of the above circumstances, and an object thereof is to provide an organic EL display device and a manufacturing method of the organic EL display device, in which a frame area can be reduced while the manufacturing cost is suppressed.

A typical organic EL display device and a manufacturing method of the organic EL display device for solving the above problem are as follows.

(1) An organic EL display device includes an inorganic insulating film including a contact part as an opening where a contact electrode made of a conductive film is exposed, a TFT circuit layer provided on the inorganic insulating film and including a circuit including a thin film transistor (TFT), an organic EL element layer provided on the TFT circuit layer and including an organic EL element whose light emission is controlled by the circuit, and a sealing layer covering the organic EL element layer and made of an inorganic insulating material.

(2) In the organic EL display device of (1) above, the organic EL display device further includes an electronic component including a terminal electrically connected to the contact electrode in the contact part.

(3) In the organic EL display device of (2) above, the electronic component is an FPC (Flexible Printed Circuit board).

(4) In the organic EL display device of (3) above, a driving integrated circuit element for controlling the circuit is mounted on the FPC.

(5) In the organic EL display device of (3) above, the FPC includes an antenna wiring for performing non-contact communication with an external control equipment.

(6) In the organic EL display device of (3) above, the FPC includes a solid metal film having an area of 25% or more of a display area in plan view.

(7) In the organic EL display device of (6) above, a touch panel is further provided on the sealing layer.

(8) In the organic EL display device of (3) above, the FPC includes the terminal, and the terminal of the FPC is electrically connected through the contact part provided in an outside frame area of the display area.

(9) In the organic EL display device of (8) above, the display is rectangular, the contact part includes a low referential potential contact part and a high referential potential contact part which receive supply of potential difference required for light emission of the organic EL element, at least one of the high referential potential contact part and the low referential potential contact part is provided at plural places, and is provided in the frame area corresponding to at least two sides of four sides of the display area.

(10) In the organic EL display device of (8) above, the display area is rectangular, the contact part includes plural image signal contact parts to receive an image signal, and the image signal contact parts are provided in the frame area corresponding to two opposite sides of the rectangular display area.

(11) In the organic EL display device of (2) above, the electronic component is a driving integrated circuit element.

(12) In the organic EL display device of (2) above, the terminal of the electronic component is connected through an anisotropic conductive film.

(13) In the organic EL display device of (1) above, a part of the contact electrode overlaps the display area in plan view.

(14) In the organic EL display device of (1) above, the contact electrode overlaps the thin film transistor of the TFT circuit layer in plan view.

(15) In the organic EL display device of (1) above, the contact electrode electrically connects plural electronic components to each other.

(16) In the organic EL display device of (13) to (15) above, the contact electrode contacts a conductive film extending from the TFT circuit layer or the organic EL element layer through a contact hole.

(17) In the organic EL display device of (1) above, the TFT circuit layer includes a signal distribution circuit to distribute an image signal inputted through a conductive film of the contact part to plural wirings.

(18) In the organic EL display device of (1) above, a sealing substrate bonded to the sealing layer and made of a transparent material is further provided.

(19) A manufacturing method of an organic EL display device includes an interlayer separation film forming step of forming an interlayer separation film on a substrate, an inorganic insulating film forming step of forming an inorganic insulating film after the interlayer separation film forming step, a circuit element forming step of forming a TFT circuit layer and an organic EL element layer including an organic EL element after the inorganic insulating film forming step, a substrate peeling step of peeling the substrate at the interlayer separation film after the circuit element forming step, and an electronic component pressure-bonding step of pressure-bonding an electronic component including a terminal to be electrically connected through a contact part where a contact electrode is exposed after the substrate peeling step.

(20) In the manufacturing method of the organic EL display device of (19) above, a sealing substrate bonding step of bonding a sealing substrate made of a transparent material onto the organic EL element layer through a sealing layer is further provided after the circuit element forming step and before the substrate peeling step.

(21) In the manufacturing method of the organic EL display device of (19) above, an etching step of etching a part or a whole surface of a peeling surface to expose the contact electrode and to form a contact part is further provided after the substrate peeling step.

(22) In the manufacturing method of the organic EL display device of (19) above, in the inorganic insulating film forming step, a conductive film which becomes the contact electrode is formed to be sandwiched in the inorganic insulating film.

(23) In the manufacturing method of the organic EL display device of (19) above, a contact part forming step of forming a contact part by forming a conductive film which becomes the contact electrode is further provided after the substrate peeling step and before the electronic component pressure-bonding step.

(24) In the manufacturing method of the organic EL display device of (23) above, a conductive film exposing step of exposing a conductive film to be connected to the contact electrode by etching a whole surface of a peeling surface is further provided before the contact part forming step.

DETAILED DESCRIPTION OF THE INVENTION

Figure 1:
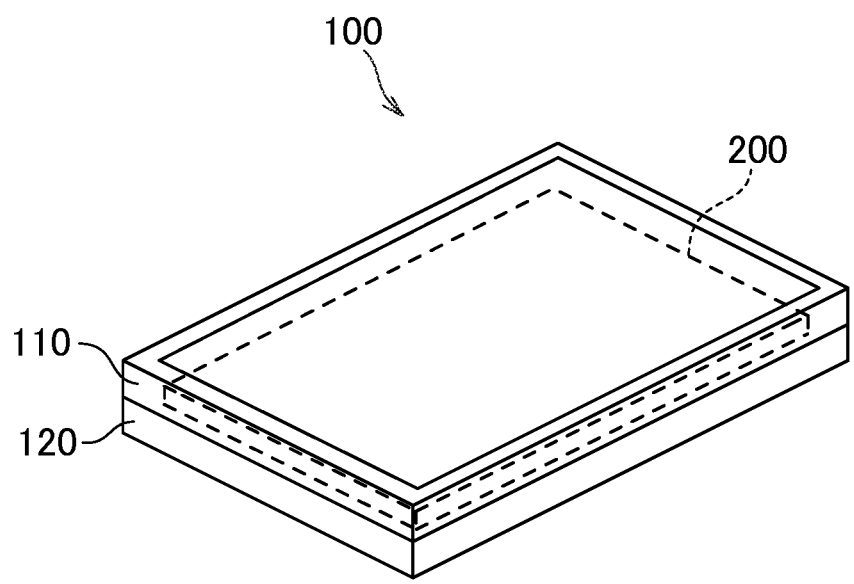
FIG. 1 is a view schematically showing an organic EL display device of an embodiment of the invention.

Hereinafter, embodiments of the invention will be described with reference to the drawings. Incidentally, the disclosure is merely an example, and modifications made within the spirit of the invention and easily conceivable by one of ordinary skill in the art should fall within the scope of the invention. Besides, in the drawings, although widths, thicknesses, shapes and the like of respective parts are schematically shown as compared with actual forms, they are merely examples and do not limit the interpretation of the invention. Besides, in the specification and the respective drawings, the same components as those already described in the previous drawings are denoted by the same reference numerals and the detailed explanation thereof is omitted.

FIG. 1 schematically shows an organic EL (Electro Luminescent) display device 100 of an embodiment of the invention. As shown in this drawing, the organic EL display device 100 includes an organic EL panel 200 fixed to be sandwiched between an upper frame 110 and a lower frame 120. Incidentally, the organic EL display device 100 is not limited to the form as stated above, and may be such that, for example, the organic EL panel 200 is fixed by one frame.

Figure 2:
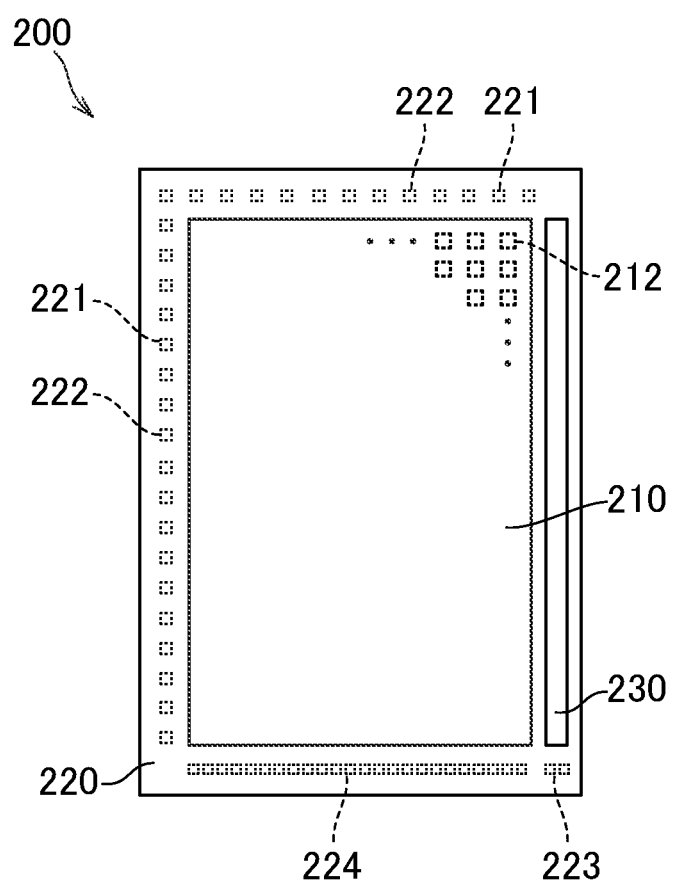
FIG. 2 is a plan view schematically showing a front surface side of an organic EL panel of FIG. 1.

FIG. 2 is a plan view schematically showing a front surface side, which is an image display direction side, of the organic EL panel 200 of FIG. 1. As shown in this drawing, the organic EL panel 200 includes a rectangular display area 210 in which pixels 212 are arranged in a matrix form. Here, an example of a pixel circuit formed in each of the pixels 212 will be described with reference to FIG. 3.

Figure 3:
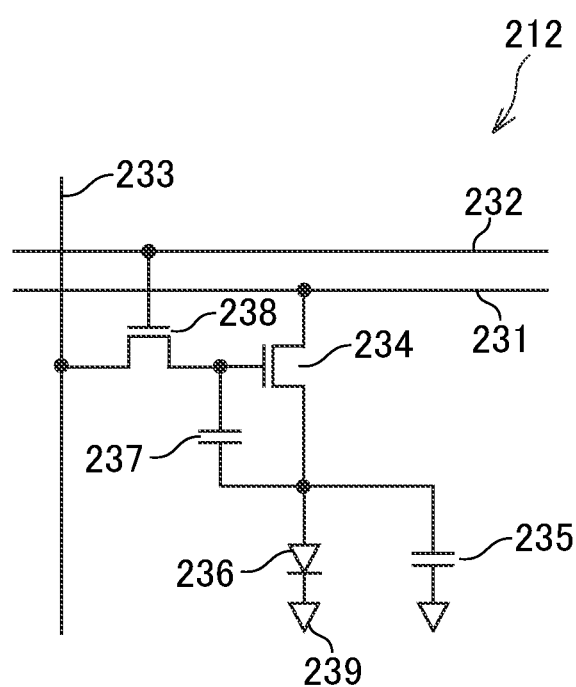
FIG. 3 is a view showing an example of a pixel circuit of the organic EL panel.

As shown in FIG. 3, the pixel circuit includes an organic EL element 236 as a light-emitting element connected to a cathode electrode 239 kept at a low reference potential, a drive transistor 234 one of a source and a drain of which is connected to an anode of the organic EL panel 236 and the other of the source and the drain of which is connected to a high referential potential line 231 kept at a high referential potential, a pixel transistor 238 connected to a gate of the drive transistor 234 and applying an image signal applied to an image signal line 233, a holding capacitor 237 formed between the gate of the drive transistor 234 and the other of the source and the drain, and an additional capacitor 235 formed between the anode and another constant potential. An operation example of the pixel circuit will be described. First, an image signal applied to the image signal line 233 is applied to the gate of the drive transistor 234 at timing of ON/OFF of a scanning signal line 232. The holding capacitor 237 holds the voltage of the image signal, and a voltage corresponding to the image signal is kept at the gate of the drive transistor 234. A current corresponding to the voltage of the image signal flows between the source and the drain, so that the organic EL element 236 emits light. Incidentally, FIG. 3 shows an example of the pixel circuit, and the configuration of the pixel circuit can be suitably modified.

Figure 4:
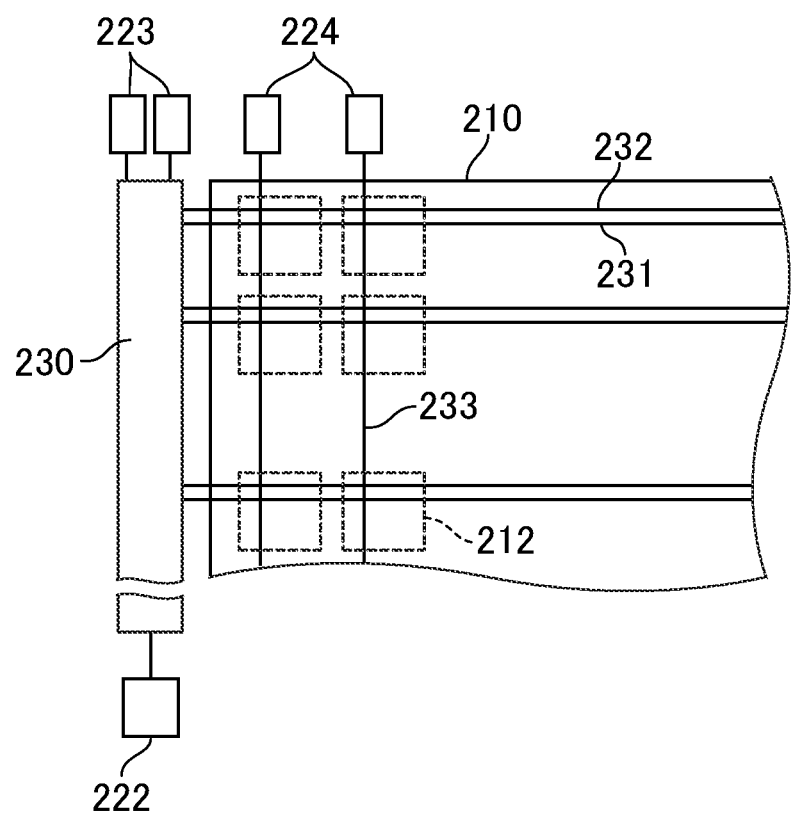
FIG. 4 is a schematic view for explaining a relation between each wiring and a contact part of FIG. 3.

FIG. 4 is a schematic view for explaining a relation between each wiring of FIG. 3 and a contact part (external connection terminal) for inputting and outputting a signal from and to the outside of the organic EL panel 200. As shown in this drawing, each of image signal lines 233 is connected to an image signal line contact part 224 as a contact part 255 (described later). The high referential potential is applied to the high referential potential line 231 through a scanning circuit 230 from a high referential potential contact part 222 as a contact part 255. The scanning circuit 230 is a circuit to apply conduction potential for turning on between the source and drain of a scanning transistor in sequence to the scanning signal line 232. A scanning circuit signal for operating the circuit is inputted from a scanning circuit signal contact part 223 as a contact part 255.

Return is made to FIG. 2. On the front surface side of the organic EL panel 200, the scanning circuit 230 is arranged at a position corresponding to one side of the display area 210 in an outside frame area (outside area) 220 of the display area 210. The respective contact parts 255 are formed at positions corresponding to the frame area 220 on the back surface side of the organic EL panel 200. Specifically, the scanning circuit signal contact part 223 is formed in the frame area 220 close to the scanning circuit 230. The image signal line contact parts 224 are arranged side by side in the frame area 220 corresponding to one side parallel to a direction in which the image signal lines 233 are arranged, that is, one side extending perpendicularly to the one side of the display area 210 where the scanning circuit 230 is arranged. The plural high referential potential contact parts 222 and plural low referential potential contact parts 221 connected to the cathode electrodes 239 are arranged along two adjacent sides where the image signal line contact part 224 and the scanning circuit 230 are not arranged. The high referential potential contact parts 222 and the low referential potential contact parts 221 may be alternately arranged, or may be arranged in another sequence such as plural by plural.

Incidentally, the cathode electrodes 239 are formed on the whole surface of the display area 210 and supply common potential to the cathodes of the organic EL elements 236 of the respective pixels. The low referential potential contact parts 221 as the contact parts 255 to supply potential to the cathode electrodes 239 and the high referential potential contact parts 222 to supply potential to the high referential potential lines 231 can be formed in the frame area 220 corresponding to at least two sides of the four sides of the display area 210. By doing so, more uniform potential can be supplied to the cathode electrodes 239 of the respective pixels 212. Besides, voltage drop in the organic EL panel 200 is suppressed, and power consumption of the organic EL display device 100 is reduced, and further, luminance gradient can be suppressed.

Incidentally, the arrangement of the contact parts 255 is not limited to the arrangement as stated above. The low referential potential contact parts 221 and the high referential potential contact parts 222 may not be provided in the frame area 220 corresponding to at least two sides, and another arrangement may be adopted in which, for example, the contact parts are not formed in the frame area 220, but formed in the display area 210. Besides, the contact parts 255 are not limited to those described above, and can be provided as necessary.

Figure 5:
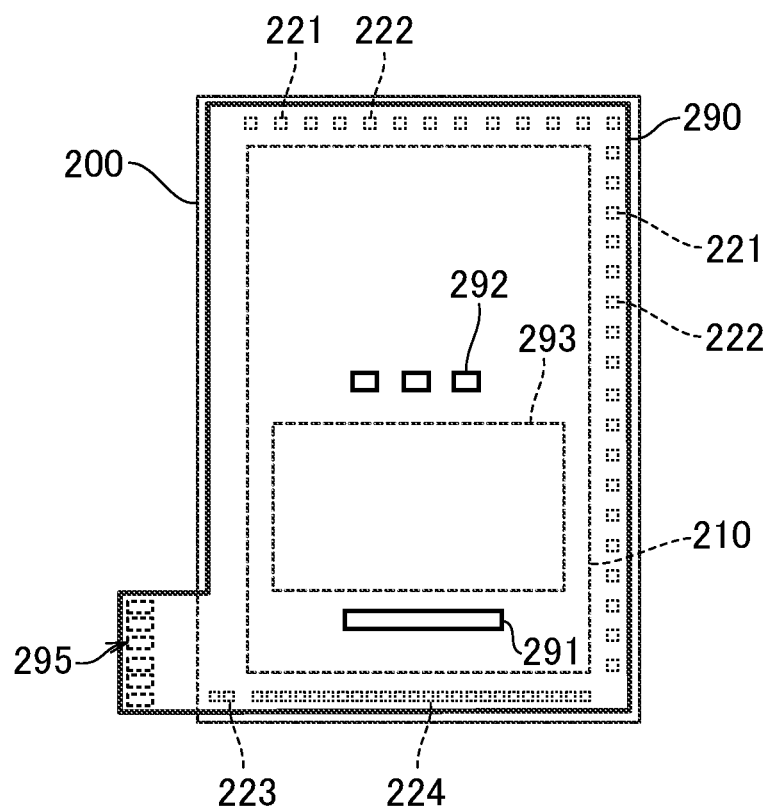
FIG. 5 is a plan view schematically showing a back surface side of the organic EL panel of FIG. 1.

FIG. 5 is a plan view showing a back surface side of the organic EL panel 200, and is a view showing a state where an FPC (Flexible Printed Circuit board) 290 as an electronic component is attached to overlap the back surface of the organic EL panel 200. As shown in this drawing, the FPC 290 is pressure-bonded using an anisotropic conductive film (AFC) or the like at the low referential potential contact parts 221, the high referential potential contact parts 222, the image signal line contact parts 224 and the scanning circuit signal contact part 223, which are the contact parts 255 of the organic EL panel 200. Incidentally, a mounting component 292 and a drive IC (Integrated Circuit) 291 as an integrated circuit to generate a signal to be applied to the contact part 255 in a part of the organic EL panel 200 are mounted on the FPC 290. Since the drive IC 291 is mounted on the FPC 290, the drive IC may not be arranged in the frame area 220 of the organic EL panel 200, and the frame area 220 can be made smaller. However, the mounting component 292 and the drive IC 291 may not be mounted on the FPC 290. The FPC 290 is connected to an external control equipment through an FPC connector 295. Besides, a solid (continuous) metal film 293 having an area of 25% or more of the display area 210 may be formed in the FPC. Heat diffusion efficiency can be raised by the formation of the solid metal film 293, and the temperature of the whole panel can be uniformed. Besides, since the metal film 293 becomes an electrostatic shield, rush-in noise from the external control equipment can be reduced. Especially, when a touch panel is mounted, since the noise from the external control equipment can be shielded, the touch panel can be made to operate at high speed and with high accuracy. The potential of the solid metal film 293 may be floating and may not be connected to another, or may be fixed to constant potential. In FIG. 5, although the solid metal film 293 is formed, the solid metal film 293 may not be formed.

Figure 6:
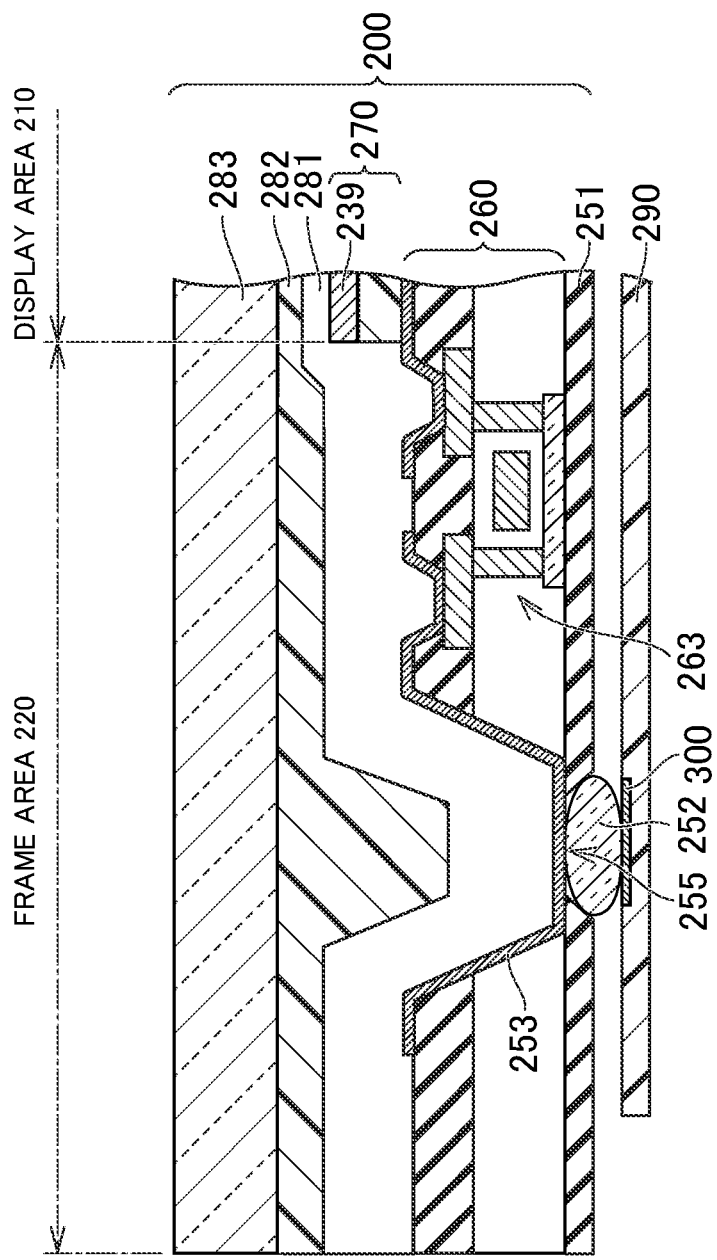
FIG. 6 is a schematic view showing a section of a vicinity of a contact part to which an FPC is connected.

FIG. 6 is a schematic view showing a section of a vicinity of the contact part 255 to which the FPC 290 is connected. As shown in this drawing, a terminal 300 of the FPC 290 is connected to the contact part 255 of the organic EL panel 200 through an anisotropic conductive film 252. Here, the anisotropic conductive film 252 is pressure-bonded to cover the whole surface of the contact part 255. However, in the drawing, only the arrangement is simply shown for explanation. The organic EL panel 200 includes an inorganic insulating film 251 made of SiN, SiO or the like, a TFT circuit layer 260 including a circuit including a thin film transistor (TFT) 263 formed on the inorganic insulating film 251, an organic EL element layer 270 formed on the TFT circuit layer 260 and including the organic EL element 236 whose light emission is controlled by the circuit of the TFT circuit layer 260, a sealing layer 281 formed on the organic EL element layer 270, made of an inorganic film of SiN or the like and interrupting the intrusion of moisture from the outside, an adhesive layer 282 made of a transparent organic material, and a sealing substrate 283 made of a transparent insulating material such as glass or plastic. Here, the contact part 255 is formed such that a contact electrode 253 is exposed in an opening of the inorganic insulating film 251. Although the contact part 255 is formed in the frame area 220 as shown in this drawing, the contact part 255 may be formed in the display area 210. Besides, low-temperature polysilicon, amorphous silicon, or another semiconductor material can be used as the semiconductor of the TFT circuit layer 260. Besides, the intrusion of moisture into the organic EL element layer 270 may be prevented by another configuration in which the sealing layer 281, the adhesive layer 282 and the sealing substrate 283 are not used.

Incidentally, in this drawing, the thin film transistor 263 is arranged as an example of the thin film transistor 263 formed in the TFT circuit layer 260 and does not limit the circuit configuration, and another thin film transistor arrangement can be suitably used. Besides, the contact electrode 253 may be connected to one of electrodes of the thin film transistor, or may be directly connected another electrode or another wiring, like the high referential potential contact part 222 or the low referential potential contact part 221. Besides, although the sealing substrate 283 may have a configuration including color filters formed in the respective pixels 212, the color filter may not be included. Besides, in the example, although the case is shown in which the terminal 300 of the FPC 290 is connected to the contact part 255 of the organic EL panel 200, a terminal of another electronic component such as a semiconductor integrated circuit element may be connected. As stated above, according to the embodiment, since the electronic component can be directly disposed on the back surface side of the organic EL panel 200 without providing a hole in the substrate, the manufacturing cost is suppressed, and the organic EL display device including the smaller frame area 220 can be provided.

Figure 7:
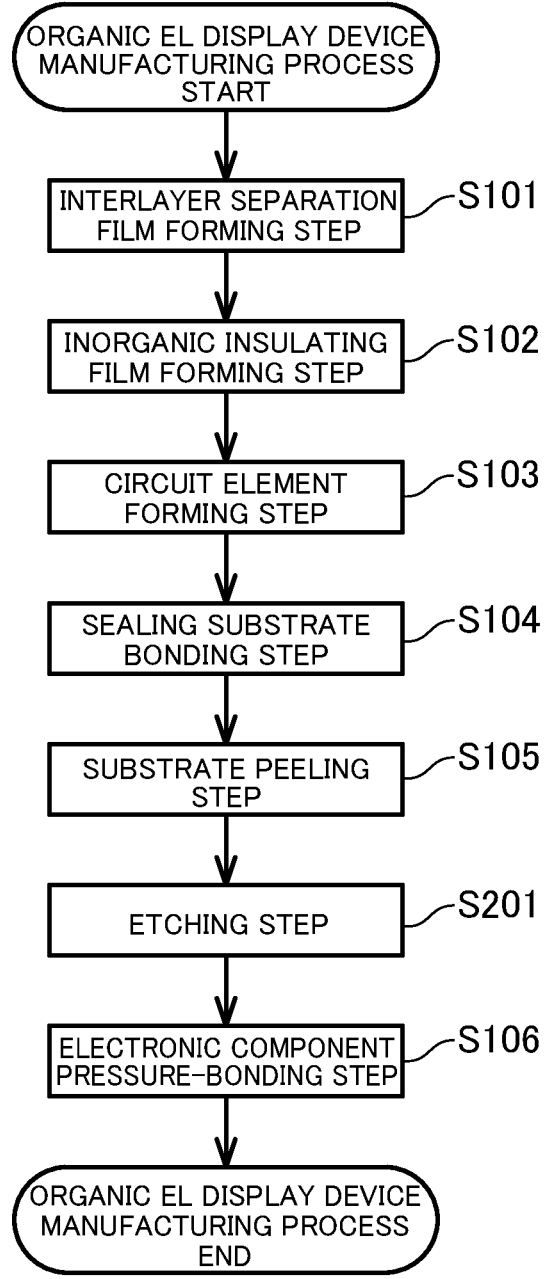
FIG. 7 is a flowchart showing a manufacturing process of the organic EL display device.

FIG. 7 is a flowchart for explaining a manufacturing process of the organic EL display device 100. As shown in the flowchart, first, at interlayer separation film forming step S101, an interlayer separation film 289 is formed on a substrate 288 made of an insulating material. The interlayer separation film 289 is a film for separating a film formed on the interlayer separation film 289 in a later step from the substrate 288, and a material may be suitably selected including a well-known material. Next, at inorganic insulating film forming step S102, an inorganic insulating film made of SiN, SiO or the like is formed. The inorganic insulating film may be used later as the inorganic insulating film 251, or may be an inorganic insulating film different from the inorganic insulating film 251 as shown in a fourth modification of FIG. 14 described later.

Thereafter, at circuit element forming step S103, the TFT circuit layer 260 including the TFT circuit and the organic EL element layer 270 including the organic EL element are formed. At the circuit element forming step S103, a conductive film in contact with the inorganic insulating film 251 through a contact hole may be formed. When necessary, the sealing layer 281 made of a material such as SiN or SiO is formed on the organic EL element layer 270, and the sealing substrate 283 made of a transparent material is bonded at sealing substrate bonding step S104. A state of a stacked structure after the sealing substrate bonding step S104 is shown by S104 of FIG. 8.

Figure 8:
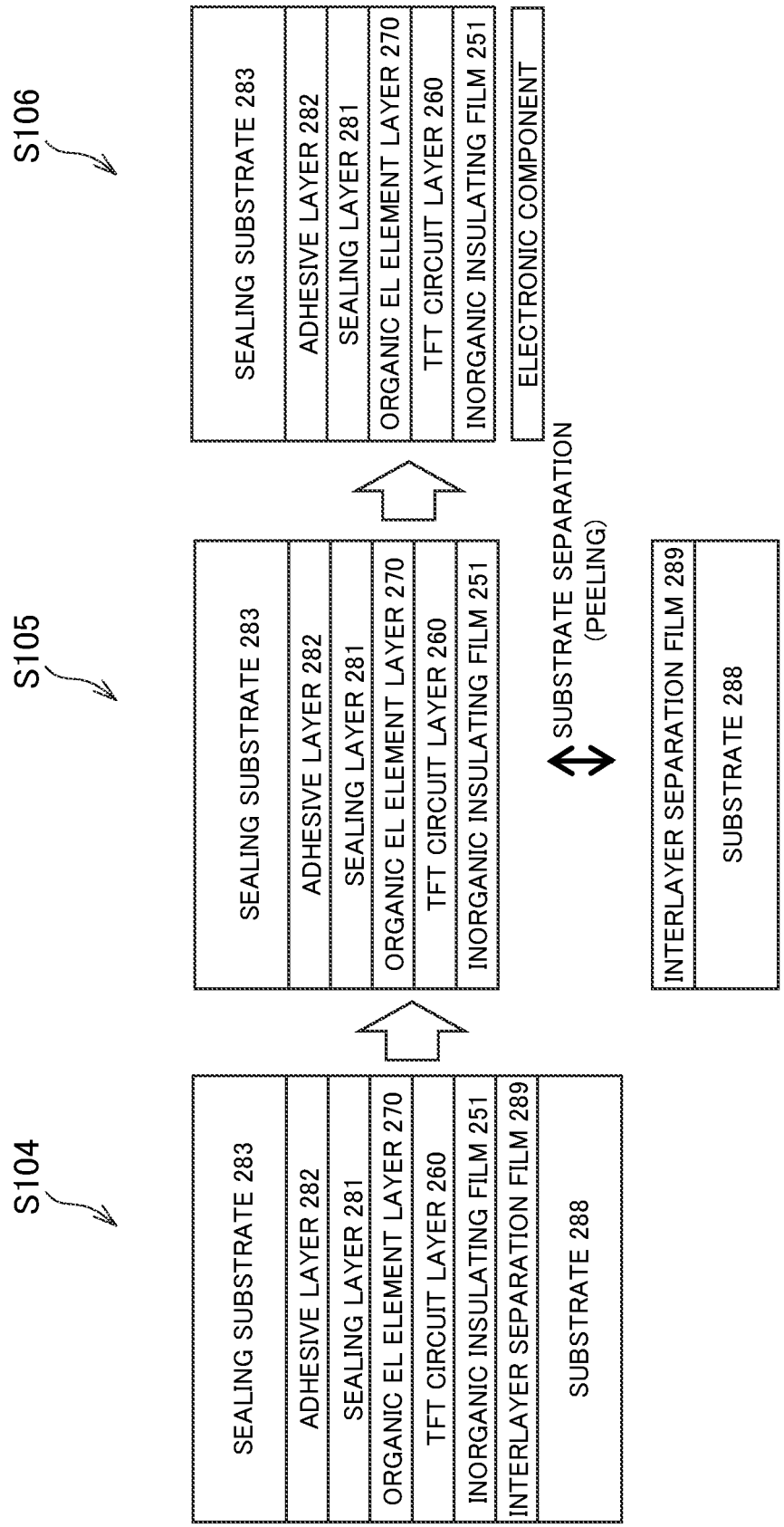
FIG. 8 is a flowchart showing a stacked structure in a sealing substrate bonding step, a substrate peeling step and an electronic component pressure-bonding step.

Thereafter, as shown in FIG. 8, at substrate peeling step S105, the substrate 288 is separated by the interlayer separation film 289. After the separation, for example, at etching step S201 of FIG. 7, apart at the contact electrode 253 of the peeling surface is etched to expose the contact electrode 253, and the contact part 255 can be formed. However, the contact part 255 can be formed without using the etching step S201, and in this case, another step can be used. Finally, at electronic component pressure-bonding step S106, a terminal 300 of an electronic component such as the FPC 290 and the contact part 255 are pressure-bonded using the anisotropic conductive film 252 and the like. Thereafter, a frame and the like are attached to the completed organic EL panel 200, so that the organic EL display device 100 is formed.

As described above, according to the manufacturing method of the embodiment, since the electronic component can be directly arranged on the back surface side of the display device without using a high cost process, the manufacturing cost is suppressed, and the organic EL display device having a smaller frame area can be formed.

Figure 9:
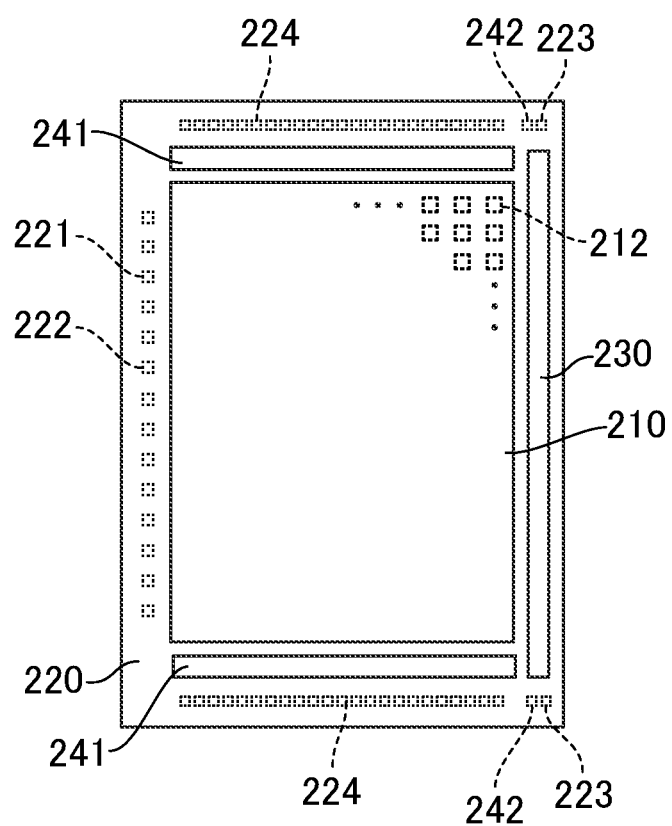
FIG. 9 is a view showing a modification of the plan view showing the front surface side of the organic EL panel of FIG. 2.

FIG. 9 shows a modification of the plan view showing a front surface side of the organic EL panel 200 of FIG. 2. As shown in this drawing, in the modification, a signal distribution circuit 241 to distribute an image signal of a composite signal into an RGB image signal is arranged in a frame area 220 corresponding to two opposite sides of a display area 210. Here, the signal distribution circuit 241 is a circuit formed in a TFT circuit layer 260 of the organic EL panel 200. Besides, a signal distribution circuit contact part 242, which is a contact part 255 to receive a control signal to the signal distribution circuit 241 from the outside, is formed near the signal distribution circuit 241. Since the number of image signal line contact parts 224 can be reduced by providing the signal distribution circuit 241, the manufacturing process can be simplified, and the yield can be improved. Besides, in the modification of FIG. 9, the image signal line contact part 224 is formed in the frame areas 220 at the two places corresponding to the two opposite sides of the rectangular display area 210. Since the image signal line contact part 224 is dispersedly arranged in the frame area 220 of the two opposite sides, the arrangement density of the image signal line contact part 224 can be reduced, the manufacturing process is simplified, and the yield can be improved. Incidentally, in this modification, although the signal distribution circuit 241 is provided, and the image signal line contact part 224 formed in the frame area 220 at the two places corresponding to the two opposite sides is provided, only one of them may be provided.

Figure 10:
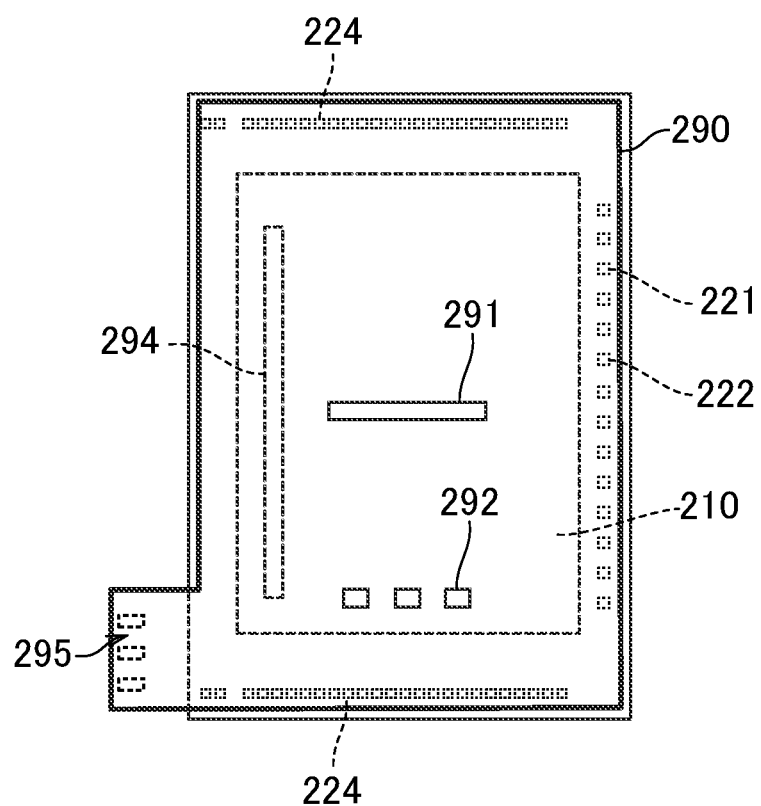
FIG. 10 is a view showing a modification of the plan view showing the back surface side of the organic EL panel of FIG. 5.

FIG. 10 shows a modification of the plan view showing the back surface side of the organic EL panel 200 of FIG. 5. The modification is different in that an antenna wiring 294 is arranged in an FPC 290. The antenna wiring 294 is configured to perform input and output to and from an external control equipment via wireless communication similarly to an FPC connector 295. Accordingly, the number of terminals of the FPC connector 295 can be reduced by providing the antenna wiring 294, the manufacturing process is simplified, and the yield can be improved.

Figure 11:
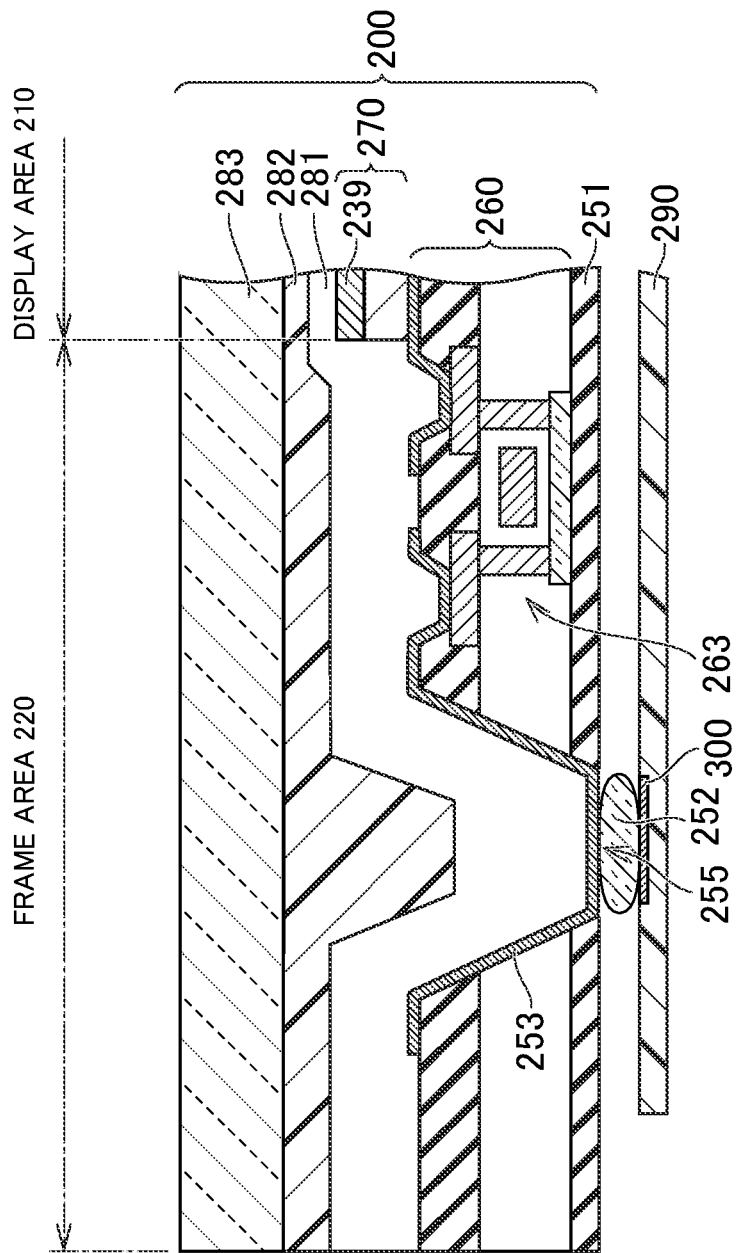
FIG. 11 is a view showing a first modification of the section of the vicinity of the contact part of FIG. 6.

FIG. 11 is a view showing a first modification of the section of the vicinity of the contact part 255 to which the FPC 290 of FIG. 6 is connected. A different point from FIG. 6 is that an inorganic insulating film 251 and a contact part 255 are formed on the same plane. Since other points are the same as those of FIG. 6, the description thereof is omitted. The inorganic insulating film 251 and the contact part 255 can be formed on the same plane as shown in FIG. 11 in such a way that at the inorganic insulating film forming step S102 of FIG. 7, the contact electrode 253 is formed in the inorganic insulating film 251, and at the etching step S201, the whole surface of the peeling surface is etched to expose the contact electrode 253. Even when the inorganic insulating film 251 and the contact part 255 are formed on the same plane as stated above, the same effects as those of the foregoing embodiment can be obtained.

Figure 12:
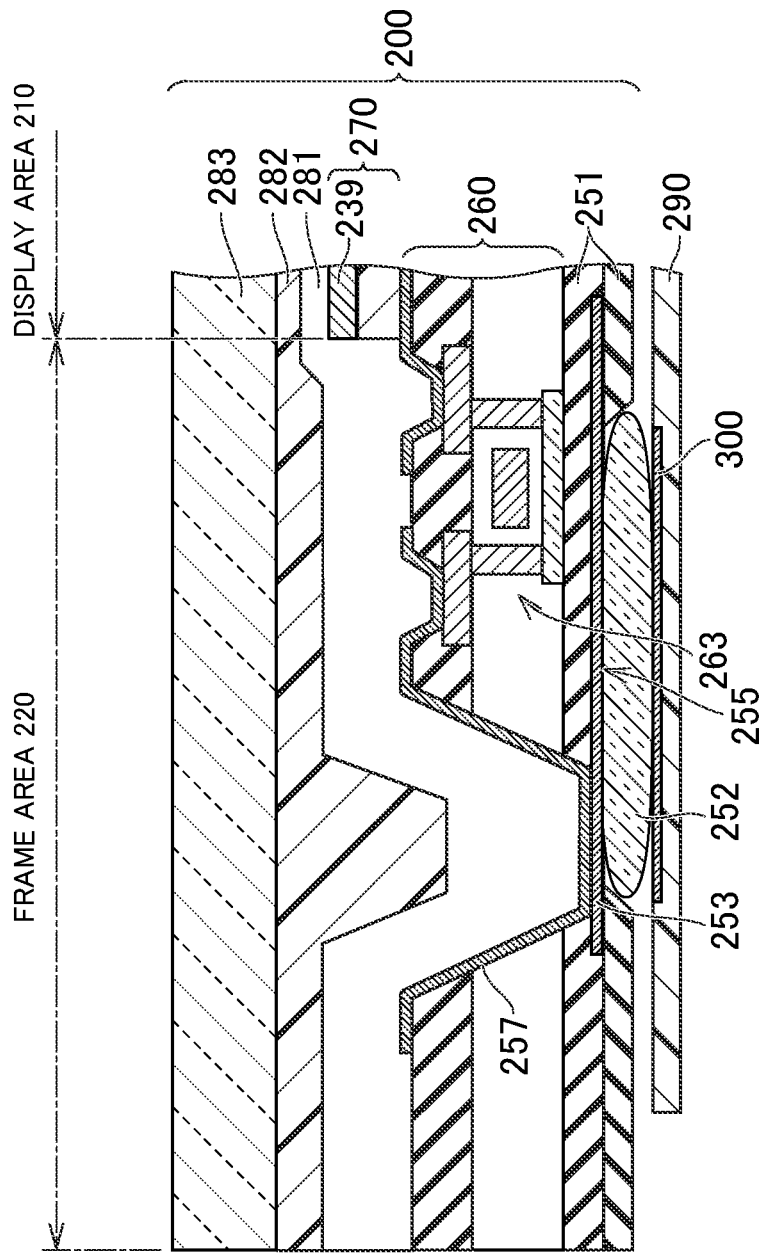
FIG. 12 is a view showing a second modification of the section of the vicinity of the contact part of FIG. 6.

FIG. 12 is a view showing a second modification of the section of the vicinity of the contact part 255 to which the FPC 290 of FIG. 6 is connected. A different point from FIG. 6 is that a contact electrode 253 is formed between inorganic insulating films 251, and a conductive film extending from a TFT circuit layer 260 or an organic EL element layer 270 contacts the contact electrode 253. By doing so, the area of a contact part 255 can be made large, and the yield at forming step of the contact part 255 and at pressure-bonding step using an anisotropic conductive film 252 can be improved. In this case, the contact electrode 253 can be formed to overlap a thin film transistor 263 in plan view. In this case, the area of the contact part 255 is made large, and the semiconductor layer of the thin film transistor 263 can be shielded, and the thin film transistor 263 can be stably operated. Besides, the contact electrode 253 can be formed to overlap the inside of the display area 210 in plan view. In this case, the contact part 255 can be formed in not only the frame area 220 but also in the display area 210. Thus, the area of the contact part 255 is made larger, and the yield can be improved. Here, the contact electrode 253 of FIG. 12 can be formed such that at the inorganic insulating film forming step S102 of FIG. 7, a conductive film which becomes the contact electrode 253 is formed to be sandwiched between the inorganic insulating films 251.

Figure 13:
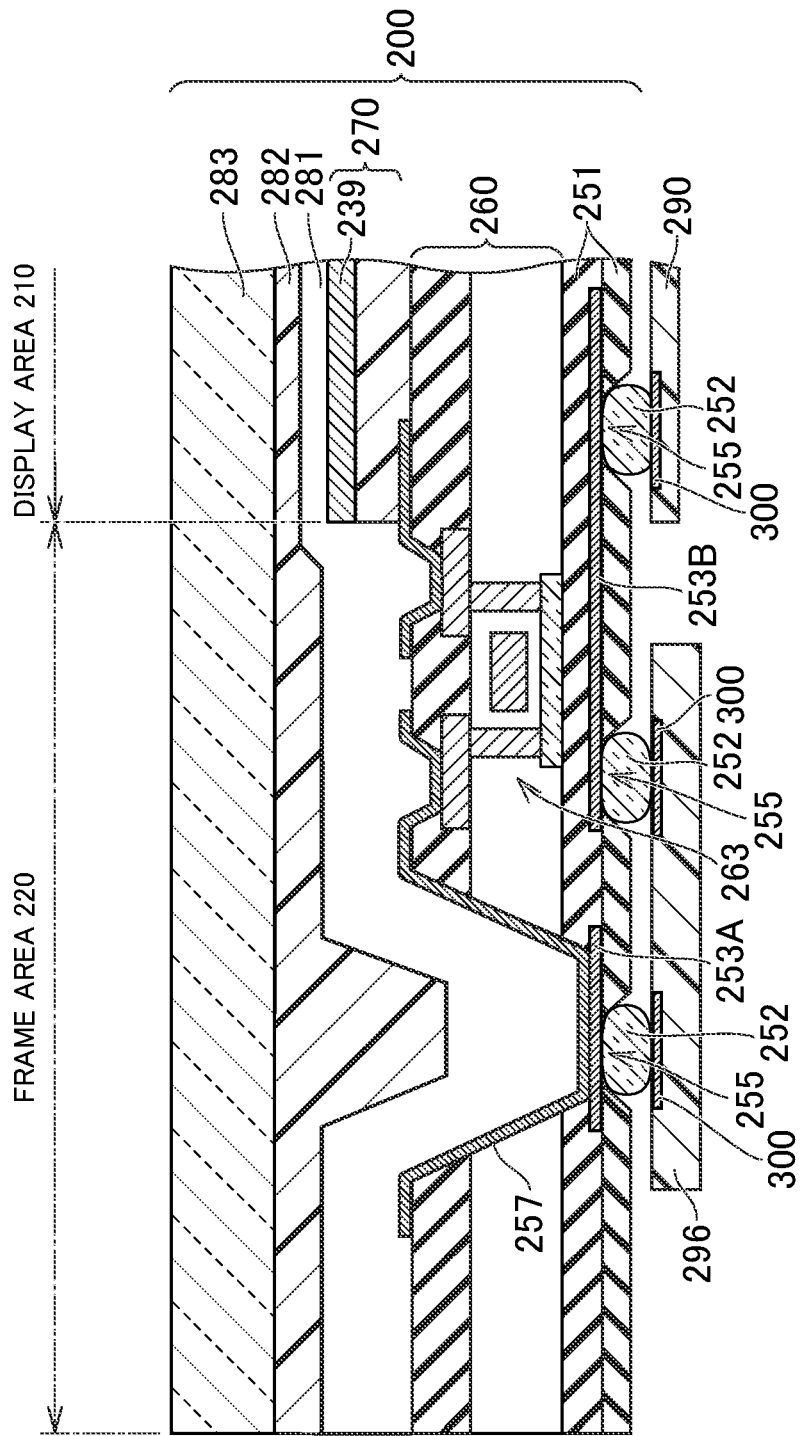
FIG. 13 is a view showing a third modification of the section of the vicinity of the contact part of FIG. 6.

FIG. 13 is a view showing a third modification of the section of the vicinity of the contact part 255 to which the FPC 290 of FIG. 6 is connected. In this drawing, a contact electrode 253 includes two electrodes of a contact electrode 253A and a contact electrode 253B. Two terminals of plural terminals of a drive IC 296 as an electronic component are connected to respective contact parts 255 of the contact electrode 253A and the contact electrode 253B through anisotropic conductive films 252. Besides, the contact electrode 253B is connected to a terminal of an FPC 290 at another contact part 255 through an anisotropic conductive film 252. Like the contact electrode 253B, plural electronic components can be electrically connected to each other. By adopting the configuration as stated above, the terminals of the electronic components can be electrically connected on the back surface side of the display device without specially providing a wiring substrate or the like.

Figure 14:
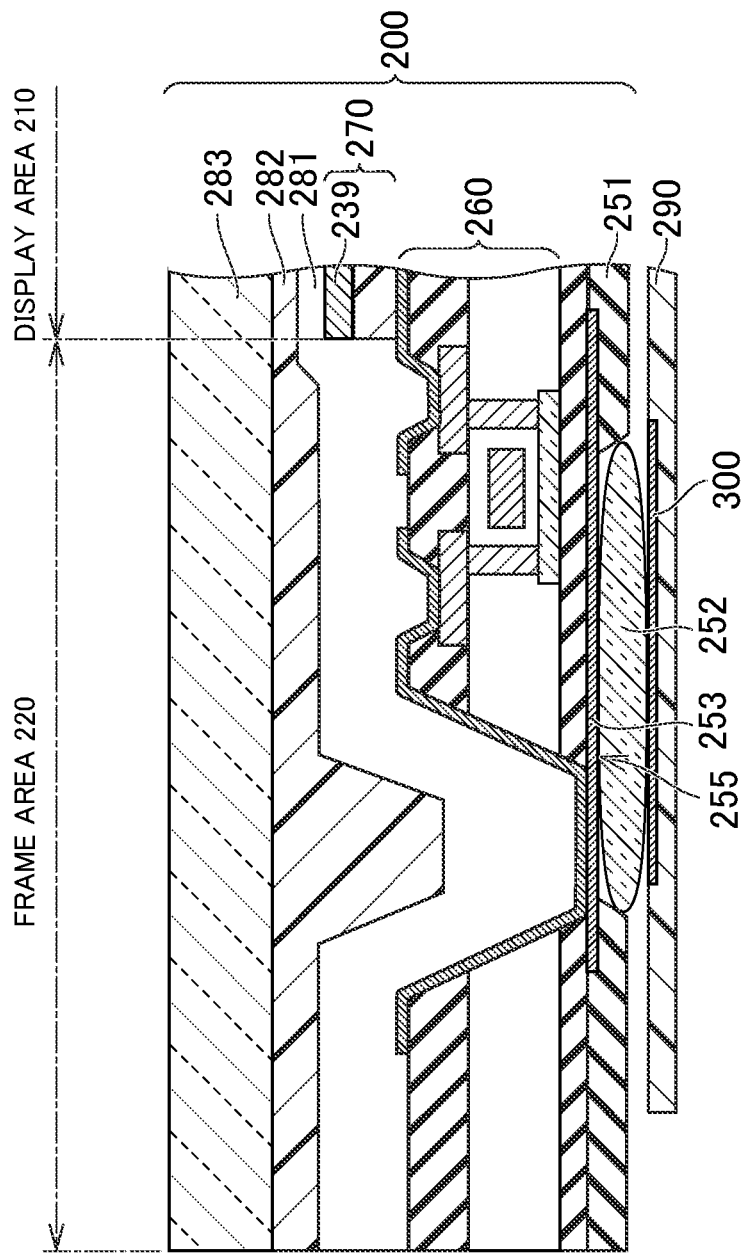
FIG. 14 is a view showing a fourth modification of the section of the vicinity of the contact part of FIG. 6.
Figure 15:
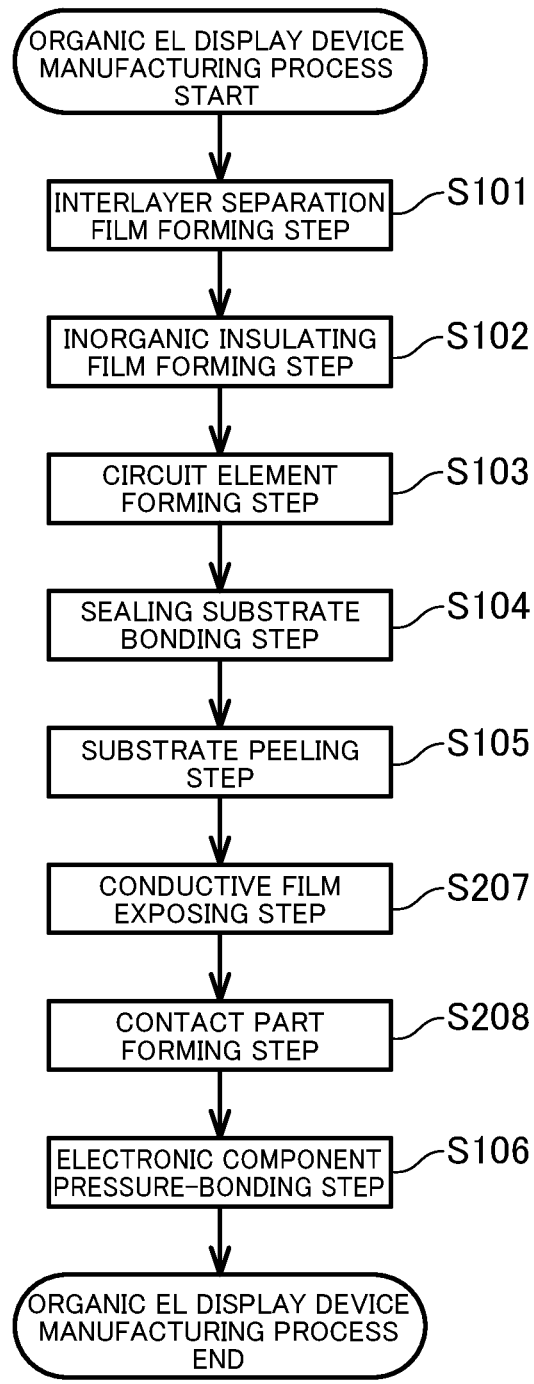
FIG. 15 is a flowchart showing a manufacturing method of an organic EL display device of the fourth modification of FIG. 14.

FIG. 14 is a view showing a fourth modification of the section of the vicinity of the contact part 255 to which the FPC 290 of FIG. 6 is connected. Although the fourth modification has the same configuration as that of the second modification of FIG. 12, a manufacturing method is different. FIG. 15 is a flowchart showing a manufacturing method of an organic EL display device 100 of the fourth modification. A different point from the flowchart of FIG. 7 is that conductive film exposing step S207 and contact part forming step S208 are added between substrate peeling step S105 and electronic component pressure-bonding step S106. Since others are the same as the flowchart of FIG. 7, the similar description is omitted. At the conductive film exposing step S207 after the substrate peeling step S105, the whole surface of the peeling surface is etched, and a conductive film to be connected to the contact electrode 253 is exposed. The exposure of the conductive film may be performed by a process other than the whole surface etching, and this process may not be performed. Next, at the contact part forming step S208, a conductive film which becomes the contact electrode 253 is formed, and the contact part 255 is formed. The section of the fourth modification can be formed by the manufacturing method including the steps as stated above.

Figure 16:
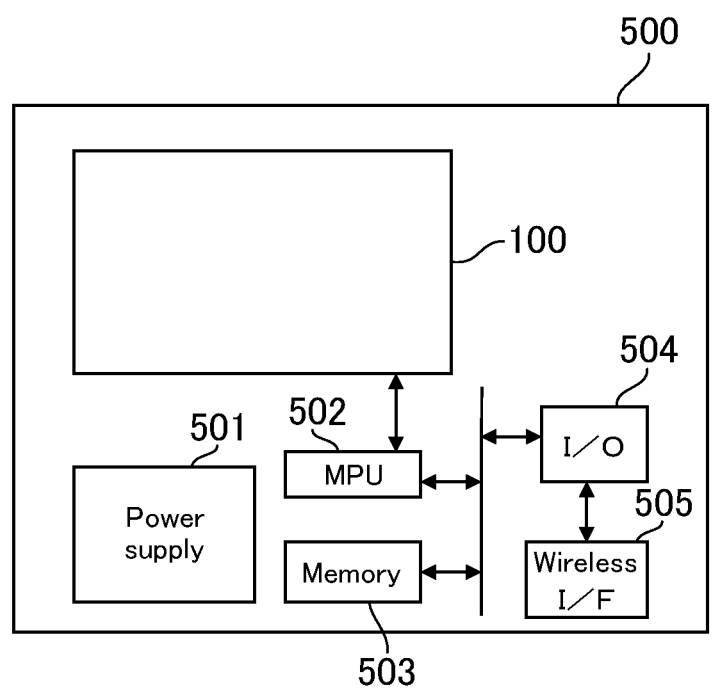
FIG. 16 is a view showing a configuration of a tablet terminal as an information processing apparatus including an organic EL display device.

FIG. 16 is a view showing a configuration of a tablet terminal 500 as an information processing apparatus including the organic EL display device 100 of the foregoing embodiment. The tablet terminal 500 includes the organic EL display device 100 of the foregoing embodiment, an input/output part 504 to perform input and output of a signal from and to hardware such as a wireless interface 505 including an antenna, a micro processor (MPU) 502 to process information from the input/output part 504 and to output display information to the organic EL display device 100 as an output device, a memory to temporarily store processing information of the micro processor 502, and a power supply device 501 to supply power to the hardware. Since the tablet terminal 500 includes the organic EL display device 100, the tablet terminal 500 can be realized in which the periphery of the display area 210 is a narrow frame area and is superior in design.

While there have been described what are at present considered to be certain embodiments of the invention, it will be understood that various modifications may be made thereto, and it is intended that the appended claim cover all such modifications as fall within the true spirit and scope of the invention.

What is claimed is:

1. An organic EL display device comprising:
a first stack having an inorganic insulating film and a conductive film which has a contact part;
a TFT circuit layer provided on the first stack, the TFT circuit layer includes a circuit including a thin film transistor (TFT, which includes a gate, a source and a drain, is electrically connected with the conductive film;
an organic EL element layer provided on the TFT circuit layer and including an organic EL element; and
a sealing layer covering the organic EL element layer and including an inorganic insulating material,
wherein the organic EL display device has a display area, in which pixels are arranged, and a frame area, and
wherein the conductive film overlaps the display area in plan view.

2. The organic EL display device according to claim 1, further comprising a terminal at an opposite side of the TFT circuit layer through the conductive film, the terminal being connected with the conductive film.

3. The organic EL display device according to claim 1, further comprising a touch panel on the sealing layer.

4. The organic EL display device according to claim 3, wherein the touch panel has a substrate provided on the sealing layer via an adhesive layer.

5. The organic EL display device according to claim 2, further comprising an electronic component which is a driving integrated circuit element to control the organic EL element and includes the terminal.

* * * * *